(12) United States Patent
Arndt et al.

(10) Patent No.: US 7,719,286 B2
(45) Date of Patent: May 18, 2010

(54) METHOD AND CIRCUIT ARRANGEMENT FOR VERIFYING ELECTRICAL CONTACTS BETWEEN A FIRST OUTPUT PIN OF A FIRST POWER SWITCH OF A POWER SWITCH DEVICE AND AN EXTERNAL NODE AND A SECOND OUTPUT PIN OF A SECOND POWER SWITCH OF SAID POWER SWITCH DEVICE AND SAID NODE

(75) Inventors: Bastian Arndt, Eilsbrunn (DE); Gunther Wolfarth, Regensburg-Harting (DE)

(73) Assignee: Siemens Aktiengesellschaft, Munich (DE)

( * ) Notice: Subject to any disclaimer, the term of this patent is extended or adjusted under 35 U.S.C. 154(b) by 243 days.

(21) Appl. No.: 11/815,212

(22) PCT Filed: Nov. 25, 2005

(86) PCT No.: PCT/EP2005/056236

§ 371 (c)(1),
(2), (4) Date: Aug. 1, 2007

(87) PCT Pub. No.: WO2006/081881

PCT Pub. Date: Aug. 10, 2006

(65) Prior Publication Data

US 2008/0150539 A1     Jun. 26, 2008

(30) Foreign Application Priority Data

Feb. 1, 2005  (DE) ..................... 10 2005 004 608

(51) Int. Cl.
*G01R 31/08*  (2006.01)

(52) U.S. Cl. ................ 324/522; 324/512; 324/525
(58) Field of Classification Search .............. 324/522, 324/525, 512
See application file for complete search history.

(56) References Cited

U.S. PATENT DOCUMENTS 5,357,519 A * 10/1994 Martin et al. ............. 714/25

(Continued)

FOREIGN PATENT DOCUMENTS

DE         214 462        10/1984

(Continued)

*Primary Examiner*—Timothy J Dole
*Assistant Examiner*—Farhana Hoque
(74) *Attorney, Agent, or Firm*—Laurence A. Greenberg; Werner H. Stemer; Ralph E. Locher

(57) ABSTRACT

A first voltage, which is dropped out onto a pull-down resistor that is coupled to a first power circuit breaker, is compared to an adjustable first reference voltage in order to determine a first comparative value. A second voltage, which is dropped out onto the pull-up resistor that is coupled to the second power circuit breaker, is compared to an adjustable second reference voltage in order to determine a second comparative value. Determination then occurs according to the first comparative value and second comparative value as to whether the first output pin of the first power circuit breaker and the second output switch of the second power circuit breaker are contacted to each other. The first output pin and second output pin are connected to one another by way of a node outside the power circuit breaker.

11 Claims, 1 Drawing Sheet

U.S. PATENT DOCUMENTS

| | | | |
|---|---|---|---|
| 5,867,014 A * | 2/1999 | Wrathall et al. | 323/316 |
| 6,385,739 B1 * | 5/2002 | Barton et al. | 714/25 |
| 6,573,753 B1 * | 6/2003 | Snyder | 326/87 |
| 6,633,999 B1 * | 10/2003 | Lee | 714/30 |
| 6,792,378 B2 * | 9/2004 | Chen et al. | 702/119 |

FOREIGN PATENT DOCUMENTS

| | | |
|---|---|---|
| DE | 103 47 979 A1 | 5/2005 |
| EP | 0 287 919 A1 | 10/1988 |
| EP | 0 706 265 A2 | 4/1996 |
| EP | 1 306 680 A1 | 5/2003 |
| JP | 08 023074 A | 1/1996 |

\* cited by examiner

_METHOD AND CIRCUIT ARRANGEMENT FOR VERIFYING ELECTRICAL CONTACTS BETWEEN A FIRST OUTPUT PIN OF A FIRST POWER SWITCH OF A POWER SWITCH DEVICE AND AN EXTERNAL NODE AND A SECOND OUTPUT PIN OF A SECOND POWER SWITCH OF SAID POWER SWITCH DEVICE AND SAID NODE_

BACKGROUND OF THE INVENTION

Field of the Invention

The invention relates to a method for verifying electrical contacts between a first output pin of a first power switch of a power switch device and an external node and a second output pin of a second power switch of said power switch device and said node.

It is well known that electronic power switches such as, for example, half-bridges, full-bridges, high-side switches, low-side switches or the like, are used in many applications for switching loads. Electronic power switch devices often have a plurality of power switches, the latter being interconnected and used as a single unit. For technical grounds reasons it may be necessary in the interests of increasing current carrying capacity for power switch devices of this kind to use two output pins. For this purpose it is necessary to distribute the outputs of the power switches symmetrically onto the two output pins. The two output pins must then be connected outside of the power switch devices by means of a node.

Power switch devices of said kind are frequently equipped with diagnostic circuits by means of which currents and voltages can be measured. By means of said measured currents and voltages fault symptoms such as "overcurrent" (OC), "low voltage over transistor" (LVT) or "open load voltage" (VOL) are detected by hardware. Based on the detected fault symptoms it is then decided by software means whether a particular type of fault is present. Present diagnostic circuits are used, as is well known, for detecting fault symptoms and not for verifying the electrical contacting of the output pins of the power switch devices, for example on a printed circuit board.

A known diagnostic circuit consists for example of a pullup structure and a pulldown structure, of resistors or current sources for example.

Due to manufacturing-related technical problems it can however happen that an output pin is not contacted electrically. If this occurs in the case of a power switch device with only one output pin, this can be detected in the known manner by way of the diagnostic circuits. If, however, the power switch device has two output pins, this is no longer possible. If one output pin is not contacted in this case, then the desired current carrying capacity of the power switch device cannot be achieved, with the consequence that the power switch device cannot drive the load. As a result such a power switch device in which one of the output pins that are to be connected to each other is not contacted is unusable for the purpose of providing the desired current carrying capacity on the output side. Consequently it is necessary to verify the proper contacting of the power switches with their respective output pins after assembly of the power switch device.

In a method practiced at the present time for verifying whether both output pins of the power switch device are contacted, use is made of a capacitive measurement technique. With said capacitive measurement technique, an increased capacitance is indicated if there is no electrical connection between the two output pins and their respective power switches. Alternatively the output pins can also be x-rayed during manufacture and evaluated via a special image processing system. Said aforementioned generally known methods for verifying the contacting of the two output pins require specialized measuring equipment in each case in order to perform the measurements. Said specialized measuring equipment for performing the measurements is cost-intensive, however.

SUMMARY OF THE INVENTION

The object of the present invention therefore consists in accomplishing the electrical contacting of output pins of a power switch device that are to be connected to each other in a simple and optimally cost-effective manner. Ideally, no additional measuring devices should be necessary for performing the verification.

According to the invention at least one of said addressed objects is achieved by means of a method having the features of claim 1 as well as by means of a circuit arrangement for performing said method having the features of claim 8.

Practically every power switch device is equipped with a diagnostic circuit for diagnostic purposes, such as, for example, for detecting the fault symptoms referred to in the introduction. By using the already available diagnostic circuit for diagnostic purposes it is advantageously achieved that the two output pins that are to be connected outside of the power switching device can be verified for proper contacting without additional measuring devices. For this purpose the pullup structure of the power switch device is connected to one output pin and the pulldown structure of the power switch device is connected to the other output pin. In this way costs for checking the two output pins are saved because there is no necessity for measuring devices that are to be provided specially. Furthermore, by using said diagnostic circuit it is achieved that in contrast to complex alternatives the method according to the invention is very easy to perform.

Advantageous embodiments and developments of the invention will emerge from the dependent claims as well as from the description with reference to the drawings.

According to a preferred embodiment of the invention the pullup resistor and the pulldown resistor are interconnected in such a way that they embody a voltage divider between a test voltage and ground. Advantageously by measuring the divided test voltage in each case at the pullup resistor and at the pulldown resistor it is possible to verify in a simple manner whether the two output pins of the power switch device are contacted.

According to a preferred development the pullup resistor and the pulldown resistor are embodied in such a way that they have an identical resistance value. Advantageously, the method according to the invention is further simplified owing to the identical resistance value for the pullup resistor and the pulldown resistor.

According to a further preferred development the first reference voltage is set such that it is less than one half of a test voltage.

According to a further preferred development the second reference voltage is set such that it is greater than one half of a test voltage.

According to a further preferred development the first comparative value is set to a positive logic signal level if the first voltage is greater than the first reference voltage.

According to a further preferred development the first comparative value is set to a negative logic signal level if the first voltage is less than the first reference voltage.

According to a further preferred development the second comparative value is set to a positive logic signal level if the second voltage is greater than the second reference voltage.

According to a further preferred development the second comparative value is set to a negative logic signal level if the second voltage is less than the second reference voltage.

According to a further preferred development it is established in method step (e) that the contacting between the first output pin and the first power switch and/or the contacting between the second output pin and the second power switch has been interrupted if the first comparative value is set to a negative logic signal level and the second comparative value is set to a positive logic signal level.

The invention is explained in more detail below with reference to the exemplary embodiments depicted in the schematic figures of the drawing, in which:

DESCRIPTION OF THE INVENTION

Unless expressly stated otherwise, identical or functionally identical elements and signals have been provided with the same reference symbols throughout all the figures.

Figure 1:
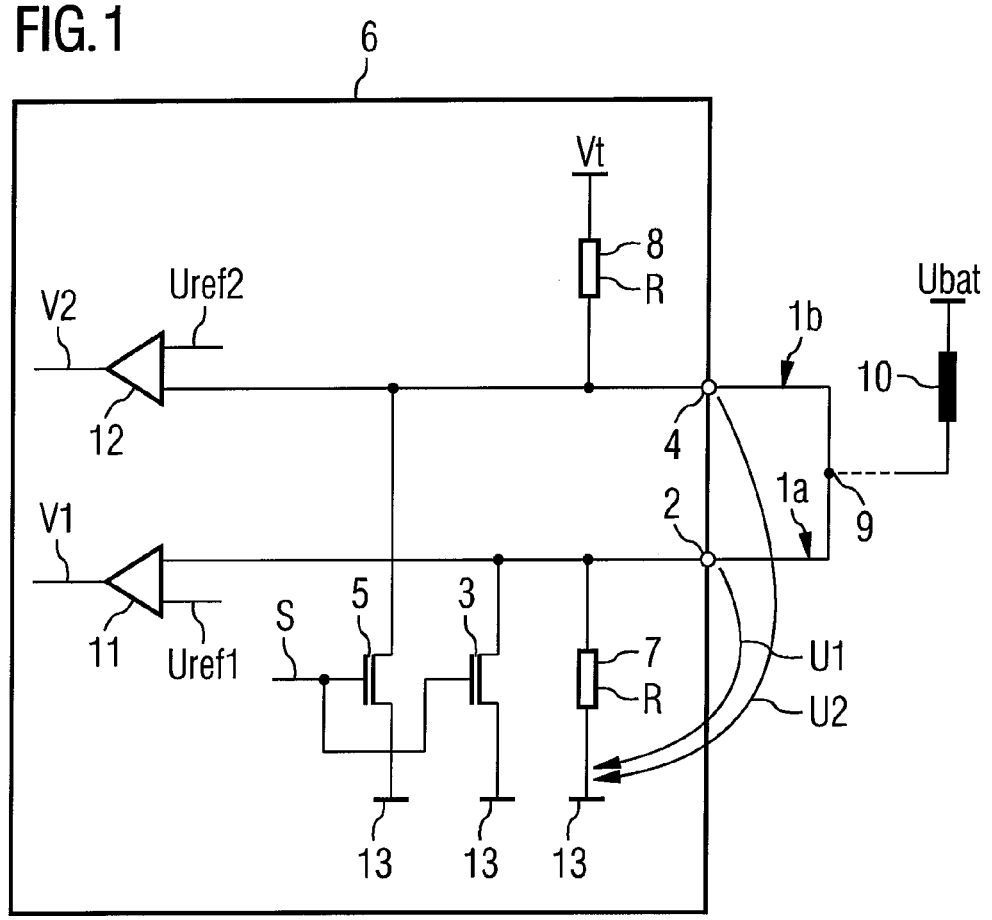
FIG. 1 shows a schematic block diagram of an exemplary embodiment of a power switch device in which the inventive method according to FIG. 2 can be applied.

FIG. 1 shows a schematic block diagram of an exemplary embodiment of a power switch device 6 in which the inventive method described below with reference to FIG. 2 can be used.

The power switch device 6 according to FIG. 1 has a first power switch 3 and a second power switch 5. The two power switches 3, 5 are controlled by means of a control signal S. The first power switch 3 is coupled to a pulldown resistor 7 of the power switch device 6. The second power switch 5 is coupled to a pullup resistor 8 of the power switch device 6. In a correct manufacturing process the first power switch 3 is connected to the first output pin 2. In a correct manufacturing process the second power switch 5 is connected to the second output pin 4.

The load 10 which is to be switched by means of the power switch device 6 and which is operated by means of a supply voltage Ubat is connected to a node 9, to which the first output pin 2 and the second output pin 4 of the power switch device 6 are also connected.

The pullup resistor 8 and the pulldown resistor 7 are preferably interconnected in such a way that they embody a voltage divider between the test voltage Vt and ground 13. The pullup resistor 8 and the pulldown resistor 7 preferably have the identical resistance value R.

The first reference voltage Uref1 is preferably set such that it is less than a one-half test voltage Ut/2. The second reference voltage Uref2 is preferably set such that it is greater than the one-half test voltage Ut/2.

The first comparative value V1 is set for example to a positive logic signal level if the first voltage U1 is greater than the first reference voltage Uref1. Otherwise the first comparative value V1 is set to a negative logic signal level.

The second comparative value V2 is set for example to a positive logic signal level if the second voltage U2 is greater than the second reference voltage Uref2. Otherwise the second comparative value V2 is set to a negative logic signal level.

The power switch device 6 has a first comparator 11 and a second comparator 12 which are used, as is known, in conventional methods for determining fault symptoms such as overcurrent, low voltage over transistor or open load voltage.

According to the invention, however, the first comparator 11 and the second comparator 12 are used to check whether there exists an electrical contact 1a between the first output pin 2 and the first power switch 3, and an electrical contact 1b between the second output pin 4 and the second power switch 5.

Toward that end the first comparator 11 compares the first voltage U1 present at the output pin 2 with the first reference voltage Uref1 which is set such that it is less than the one-half test voltage Ut/2. The first comparator 11 then sets the first comparative value V1 to a positive logic signal level if the first voltage U1 is greater than the first reference voltage Uref1.

The second comparator 12 compares the second voltage U2 present at the second output pin 4 with the second reference voltage Uref2 which is set such that it is greater than the one-half test voltage Ut/2. The second comparator 12 then sets the second comparative value V2 to a positive logic signal level on the output side if the second voltage U2 is greater than the second reference voltage Uref2.

According to the invention it is established that the contact 1a between the first output pin (2) and the external node (9) and/or the contact (1b) between the second output pin (4) and the external node (9) have/has been interrupted if the first comparative value (V1) is set to a negative logic signal level and the second comparative value (V2) is set to a positive logic signal level. If this is established, the power switch device 6 verified after manufacture is not suitable for transferring the desired current by means of the two output pins 2, 4 via the common node 9.

Figure 2:
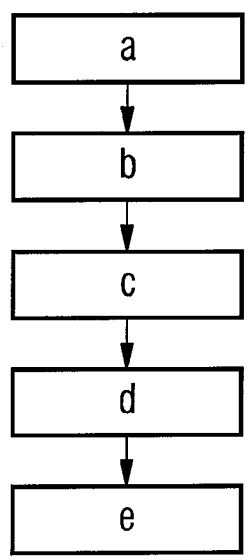
FIG. 2 shows a schematic flowchart of a preferred exemplary embodiment of the method according to the invention.

FIG. 2 shows a schematic flowchart of a preferred exemplary embodiment of the inventive method for verifying electrical contacts 1a,1b between the first output pin 2 and the external node 9 and between the second output pin 4 and the node 9 of a power switch device 6. In this arrangement the first power switch 3 is coupled to the pulldown resistor 7 of the power switch device 6 and the second power switch 5 is coupled to the pullup resistor 8 of the power switch device 6. In addition the first output pin 2 and the second output pin 4 are connected to a common node 9 outside of the power switch device 6 (see in particular FIG. 1).

The method according to the invention is explained below with reference to the block diagram in FIG. 2. The method according to the invention comprises the following method steps:

Method Step a:

The first power switch 3 is coupled to a pulldown resistor 7 and the second power switch is coupled to a pullup resistor 8.

Method Step b:

The first output pin 2 and the second output pin 4 are connected to each other via a node 9 which is disposed outside of the power switch device 6.

Method Step c:

A first voltage U1 dropping at the pulldown resistor 7 is compared with an adjustable first reference voltage Uref1 for the purpose of determining a first comparative value V1. The first reference voltage Uref1 is preferably set such that it is less than a one-half test voltage Ut/2. For example, the first comparative value V1 is set to a positive logic signal level if the first voltage U1 is greater than the first reference voltage Uref1, and the first comparative value V1 is set to a negative logic signal level if the first voltage U1 is less than the first reference voltage Uref1.

Method Step d:

A second voltage U2 present at the output pin 4 is compared with an adjustable second reference voltage Uref2 for the purpose of determining a second comparative value V2. Preferably the second reference voltage Uref2 is set such that it is greater than the one-half test voltage Ut/2. For example, the second comparative value V2 is set to a positive logic signal level if the second voltage U2 is greater than the second reference voltage Uref2, and the second comparative value V2 is set to a negative logic signal level if the second voltage U2 is less than the second reference voltage Uref2. The pullup resistor 8 and the pulldown resistor 7 are preferably embodied in such a way that they have an identical resistance value R (compare FIG. 2).

Method Step e:

Finally, it is established as a function of the first comparative value V1 and the second comparative value V2 whether the first output pin 2 is contacted to the first power switch 3 and the second output pin 4 is contacted to the second power switch 5. Thus, if it is established that the first output pin 2 is not contacted to the first power switch 3 and the second output pin 4 is not contacted to the second power switch 5, then the manufactured power switch device 6 cannot be used for the purpose of transferring the currents of the first power switch 3 and the second power switch 5 together via the external node 9 in order to increase the current carrying capacity. Accordingly, it is preferably established that the first output pin 2 is not contacted to the first power switch 3 and the second output pin 4 is not contacted to the second power switch 5 if the first comparative value V1 is set to a negative logic signal level and the second comparative value V2 is set to a positive logic signal level.

Although the present invention has been described hereintofore with reference to the preferred exemplary embodiments, it is not restricted thereto, but can be modified in multifarious ways. For example, it is conceivable to reverse the assignment of the logic signal levels for the first and second comparative value.

The invention claimed is:

1. A method for verifying electrical contacts between a first output pin of a first power switch of a power switch device and an external node disposed externally of the power switch device and between a second output pin of a second power switch of the power switch device and the external node, comprising:
   (a) coupling the first power switch to a pull-down resistor and coupling the second power switch to a pull-up resistor;
   (b) connecting the first output pin and the second output pin to each other via the external node disposed outside of the power switch device;
   (c) comparing a first voltage present between the first output pin and ground with an adjustable first reference voltage for determining a first comparative value;
   (d) comparing a second voltage present between the second output pin and ground with an adjustable second reference voltage for determining a second comparative value; and
   (e) concluding, in dependence on the first comparative value and the second comparative value, whether the first output pin of the first power switch and the second output pin of the second power switch of the power switch device are contacted to the external node via the contacts.

2. The method according to claim 1, wherein during the coupling in method step (a) the pullup resistor and the pull-down resistor are interconnected in such a way that they embody a voltage divider between a test voltage and ground.

3. The method according to claim 2, wherein the pull-up resistor and the pull-down resistor have mutually identical resistance values.

4. The method according to claim 2, which comprises setting the first reference voltage to less than a one-half test voltage, and setting the second reference voltage greater than the one-half test voltage.

5. The method according to claim 4, which comprises setting the first comparative value to a positive logic signal level if the first voltage is greater than the first reference voltage, or setting the first comparative value to a negative logic signal level if the first voltage is less than the first reference voltage.

6. The method according to claim 5, wherein method step (e) further comprises concluding that the contact between at least one of the first output pin and the first power switch or the contact between the second output pin and the second power switch has been interrupted if the first comparative value is set to a negative logic signal level and the second comparative value is set to a positive logic signal level.

7. The method according to claim 4, which comprises setting the second comparative value to a positive logic signal level if the second voltage is greater than the second reference voltage or setting the second comparative value to a negative logic signal level if the second voltage is less than the second reference voltage.

8. The method according to claim 7, wherein method step (e) further comprises concluding that the contact between at least one of the first output pin and the first power switch or the contact between the second output pin and the second power switch has been interrupted if the first comparative value is set to a negative logic signal level and the second comparative value is set to a positive logic signal level.

9. The method according to claim 4, which comprises:
   setting the first comparative value to a positive logic signal level if the first voltage is greater than the first reference voltage, or setting the first comparative value to a negative logic signal level if the first voltage is less than the first reference voltage; and
   setting the second comparative value to a positive logic signal level if the second voltage is greater than the second reference voltage or setting the second comparative value to a negative logic signal level if the second voltage is less than the second reference voltage.

10. The method according to claim 9, wherein method step (e) further comprises concluding that the contact between at least one of the first output pin and the first power switch or the contact between the second output pin and the second power switch has been interrupted if the first comparative value is set to a negative logic signal level and the second comparative value is set to a positive logic signal level.

11. In a power switch device having a first output pin connected to a first power switch and a second output pin connected to a second power switch, a method of verifying an electrical contact connection between the first output pin of the power switch device and an external node and an electrical contact connection between the second output pin of the power switch device and the external node, the method which comprises:
   (a) connecting the first power switch to a pull-down resistor to lower a potential thereof and connecting the second power switch to a pull-up resistor to raise a potential thereof;
(b) connecting the first output pin and the second output pin to each other via the external node disposed outside of the power switch device;
(c) comparing a first voltage dropping between the first output pin and ground with an adjustable first reference voltage for determining a first comparative value;
(d) comparing a second voltage dropping between the second output pin and ground with an adjustable second reference voltage for determining a second comparative value; and
(e) concluding, in dependence on the first comparative value and the second comparative value, whether the first output pin of the first power switch and the second output pin of the second power switch of the power switch device are contacted to the external node via the electrical contact connections.

* * * * *